Figure 1:
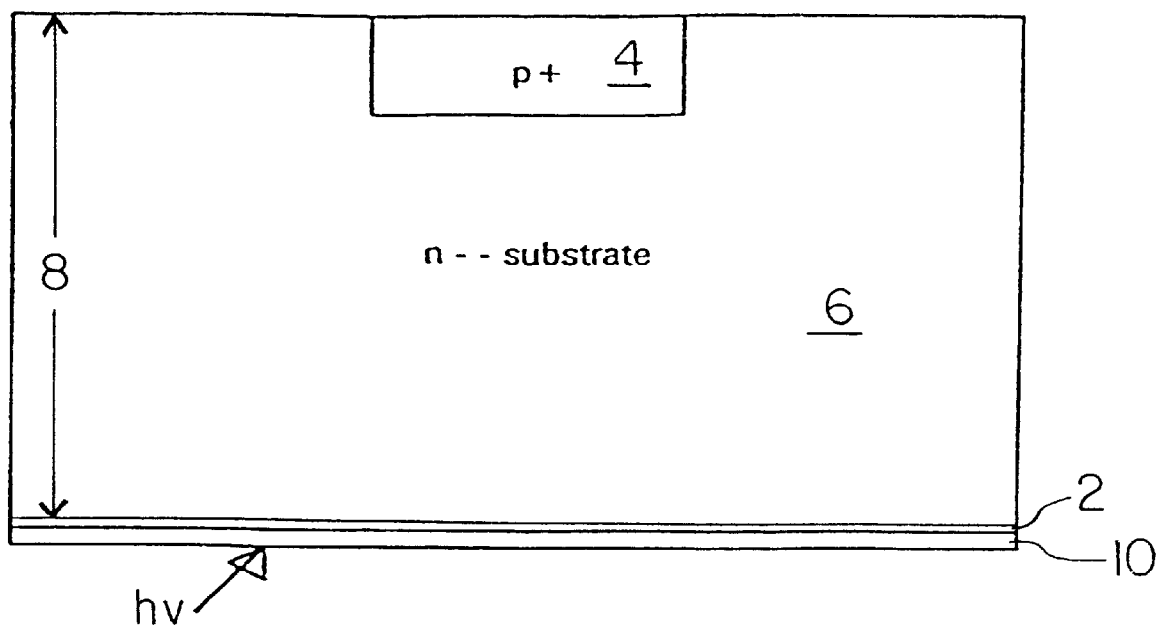

United States Patent
Holland

[19]

[11] Patent Number: 6,025,585
[45] Date of Patent: Feb. 15, 2000

[54] LOW-RESISTIVITY PHOTON-TRANSPARENT WINDOW ATTACHED TO PHOTO-SENSITIVE SILICON DETECTOR

[75] Inventor: Stephen Edward Holland, Hercules, Calif.

[73] Assignee: The Regents of the University of California, Oakland, Calif.

[21] Appl. No.: 08/961,868

[22] Filed: Oct. 31, 1997

Related U.S. Application Data

[60] Provisional application No. 60/030,415, Nov. 1, 1996.

[51] Int. Cl.$^7$ .......................... H01J 40/14; H01L 27/148
[52] U.S. Cl. .................................. 250/208.1; 250/214.1; 257/447; 257/460
[58] Field of Search ............................ 250/214.1, 214 R, 250/208.1, 208.2, 332, 370.01, 370.08, 370.09, 370.12, 370.13; 257/431, 432, 441, 442, 446, 447, 448, 457, 460, 466, 184, 188, 189; 438/66, 108, 209, 73, 94, 535

[56] References Cited

U.S. PATENT DOCUMENTS

| | | | |
|---|---|---|---|
| 4,570,329 | 2/1986 | Paine et al. | 250/332 |
| 4,695,861 | 9/1987 | Paine et al. | 257/442 |
| 5,189,297 | 2/1993 | Ahlgren | 250/214.1 |
| 5,494,833 | 2/1996 | Martin et al. | 438/66 |
| 5,541,438 | 7/1996 | Martin et al. | 257/447 |

*Primary Examiner*—John R Lee
*Attorney, Agent, or Firm*—Paul R. Martin; Henry P. Sartorio; David J. Aston

[57] ABSTRACT

The invention comprises a combination of a low resistivity, or electrically conducting, silicon layer that is transparent to long or short wavelength photons and is attached to the backside of a photon-sensitive layer of silicon, such as a silicon wafer or chip. The window is applied to photon sensitive silicon devices such as photodiodes, charge-coupled devices, active pixel sensors, low-energy x-ray sensors and other radiation detectors. The silicon window is applied to the back side of a photosensitive silicon wafer or chip so that photons can illuminate the device from the backside without interference from the circuit printed on the frontside. A voltage sufficient to fully deplete the high-resistivity photosensitive silicon volume of charge carriers is applied between the low-resistivity back window and the front, patterned, side of the device. This allows photon-induced charge created at the backside to reach the front side of the device and to be processed by any circuitry attached to the front side. Using the inventive combination, the photon sensitive silicon layer does not need to be thinned beyond standard fabrication methods in order to achieve full charge-depletion in the silicon volume. In one embodiment, the inventive backside window is applied to high resistivity silicon to allow backside illumination while maintaining charge isolation in CCD pixels.

41 Claims, 6 Drawing Sheets

MEDICI 2-D simulation

LOW-RESISTIVITY PHOTON-TRANSPARENT WINDOW ATTACHED TO PHOTO-SENSITIVE SILICON DETECTOR

This invention is disclosed in provisional application Ser. No. 60/030,415, incorporated herein by reference, and this application claims benefit of that provisional application filed, Nov. 1, 1996.

This invention was made with U.S. Government support under Contract No. DE-AC03-76SF00098 between the U.S. Department of Energy and the University of California for the operation of Lawrence Berkeley Laboratory. The U.S. Government may have certain rights in this invention.

I. BACKGROUND OF THE INVENTION

1. Field of the Invention

This invention relates generally to electromagnetic radiation detectors and more specifically to photosensitive silicon devices.

2. Description of Related Art

Charge-coupled devices (CCDs) were first used as computer memory devices. Their utility as imaging detectors was developed in the 70s. James Janesick explains the general operating principle of CCDs as imaging devices in his article, "CCDs: The Inside Story", CCD Astronomy, Winter 1997. In that article, he also describes the main current problems with CCD performance. Among those problems are absorption in the ultraviolet region and quantum efficiency (QE).

A number of techniques have been employed to enhance blue and ultraviolet sensitivity. One technique is known as 'backside illumination'. The 'frontside' of the CCD is the side of a silicon wafer on which the electronic circuitry and gates have been fabricated; the 'backside' is the other side of the wafer. When a photon enters the silicon wafer (also called the substrate) the photon is absorbed and gives rise to electronic charge (the photoelectric effect). Typically, the electronic circuitry on the frontside is made of polycrystalline silicon ('polysilicon') instead of metal because polysilicon is less reflective than metal circuitry and thus results in less photon loss when frontside illumination is used. For backside illumination, the image is focused on the backside and electrons generated by the photoelectric process must traverse the interior thickness of the silicon substrate to the silicon region just under the electronic circuitry on the frontside. Because the frontside circuitry is bypassed in backside illumination this method results in a high QE. Unfortunately, however, electrons do not traverse the thickness of the silicon substrate efficiently unless it is extremely thin (about 10 microns thick). Thinning the substrate to this extent is difficult and expensive, and has a low manufacturing yield. The thinning process is described by Burke et al., "Soft-X-Ray CCD Imagers for AXAF", IEEE Transactions on Electron Devices, 44(10):1633–42,1997.

Thinning the silicon substrate that provides the photosensitive volume (i.e. the volume in which a photon is absorbed and creates a charge carrier) also makes it difficult to detect long wavelength photons, because the thinned wafer is likely to be transparent to photons in the red and infrared. The long wavelength photon is not absorbed by the thinned photon-sensitive silicon substrate and thus is not detected. That means a single conventional back-illuminated device cannot be used to detect both short and long wavelength photons.

Sensitivity of CCDs is partly a function of the extent to which charge in individual pixels can be stored without current leakage or extraneous current entering the pixel well. A technique called pinning is used to limit dark current, and to influence residual image, pixel non-uniformity and well capacity (James Janesick and Tom Elliot, "History and advancement of large area array scientific CCD imager," in Astronomical CCD Observing and Reduction, Astronomical Society of Pacific Conf., vol. 23, BookCrafters, Inc., Tucson, Ariz.; 1992).

II. SUMMARY OF THE INVENTION

The invention comprises a combination of a low resistivity, or electrically conducting, silicon window that is transparent to long or short wavelength photons and is attached to the backside of a photon-sensitive layer of silicon, such as a silicon wafer or chip. The window is applied to photon sensitive silicon devices such as photodiodes, charge-coupled devices, active pixel sensors, low-energy x-ray sensors and other radiation detectors. The silicon window is applied to the back side of a photosensitive silicon wafer or chip so that photons can illuminate the device from the backside without interference from the circuit printed on the frontside. It is thus called a backside layer. When operating a device made with the inventive combination, voltage sufficient to fully deplete the high-resistivity photosensitive silicon volume of charge carriers is applied between the low-resistivity back window and the front, patterned, side of the device. This novel step in operating such photon sensitive devices is made possible by the presence of an electrically conducting backside layer. The voltage applied to the backside layer allows photon-induced charge created at the backside to reach the front side of the device and to be processed by any circuitry attached to the front side.

Using the inventive combination, the photon sensitive silicon layer does not need to be thinned beyond standard fabrication methods in order to achieve full charge-depletion in the silicon volume. In one embodiment, the inventive backside window is applied to high resistivity silicon to allow backside illumination while maintaining charge isolation in CCD pixels.

III. SUMMARY DESCRIPTION OF THE DRAWINGS

FIG. 1 schematically illustrates the inventive combination as used in a backside-illuminated p-i-n photodiode structure.

Figure 2A:
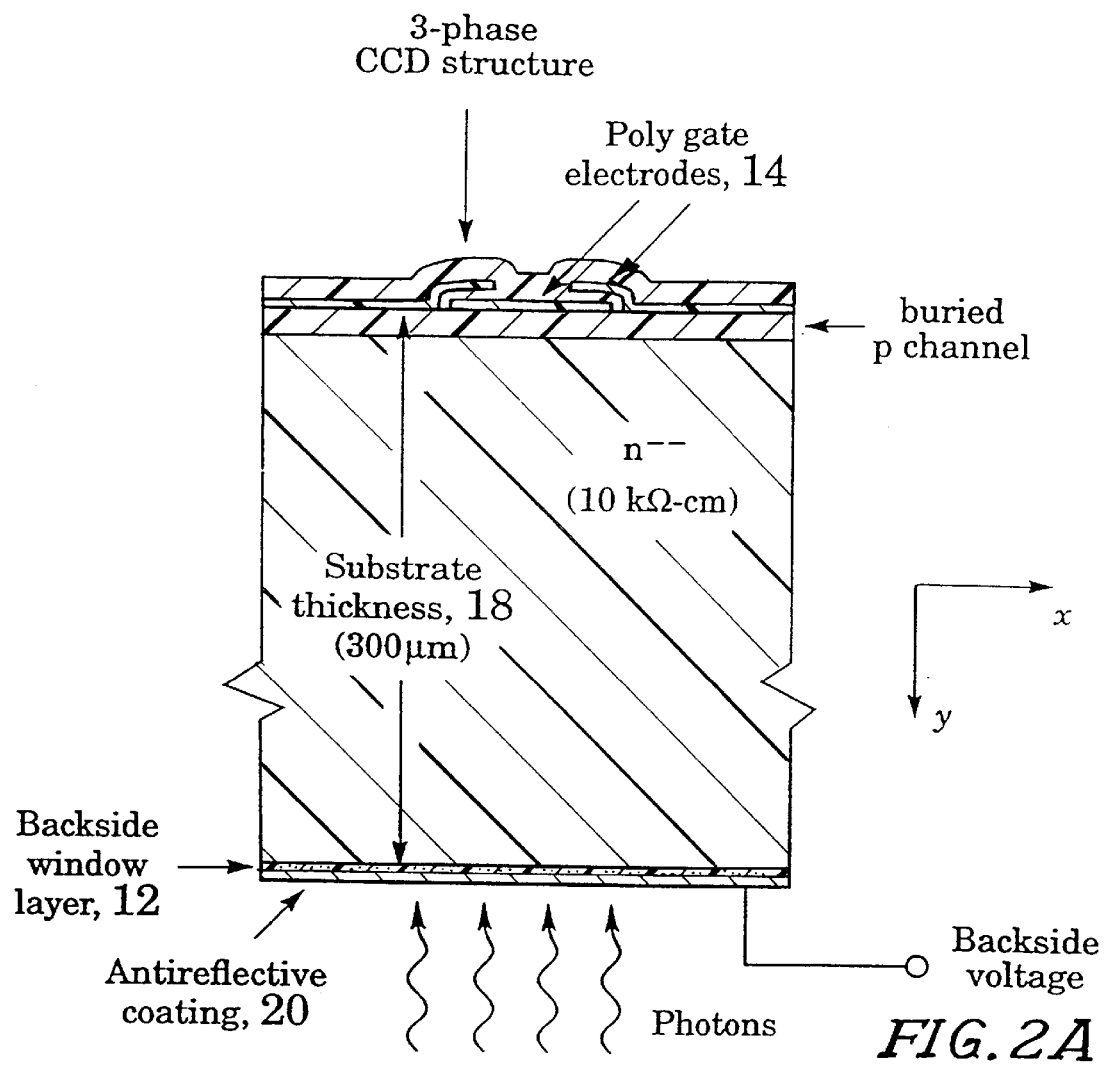

FIG. 2A: schematically illustrates the inventive combination as used in a backside-illuminated CCD structure.

Figure 2C:
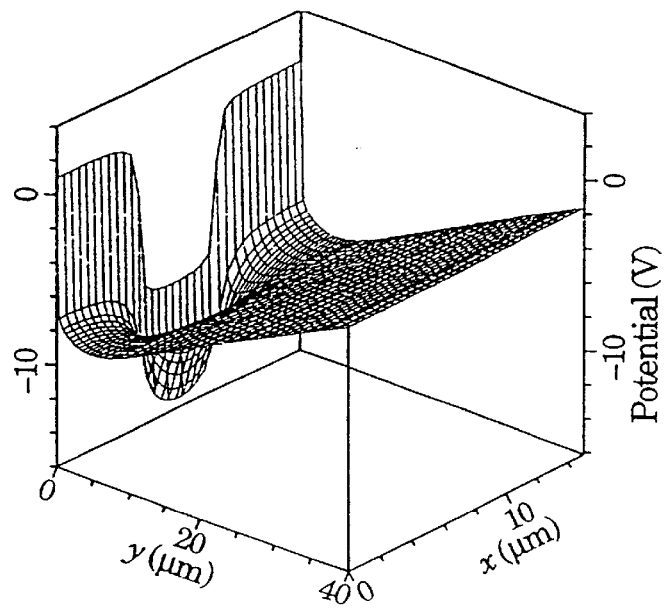
Figure 2B:
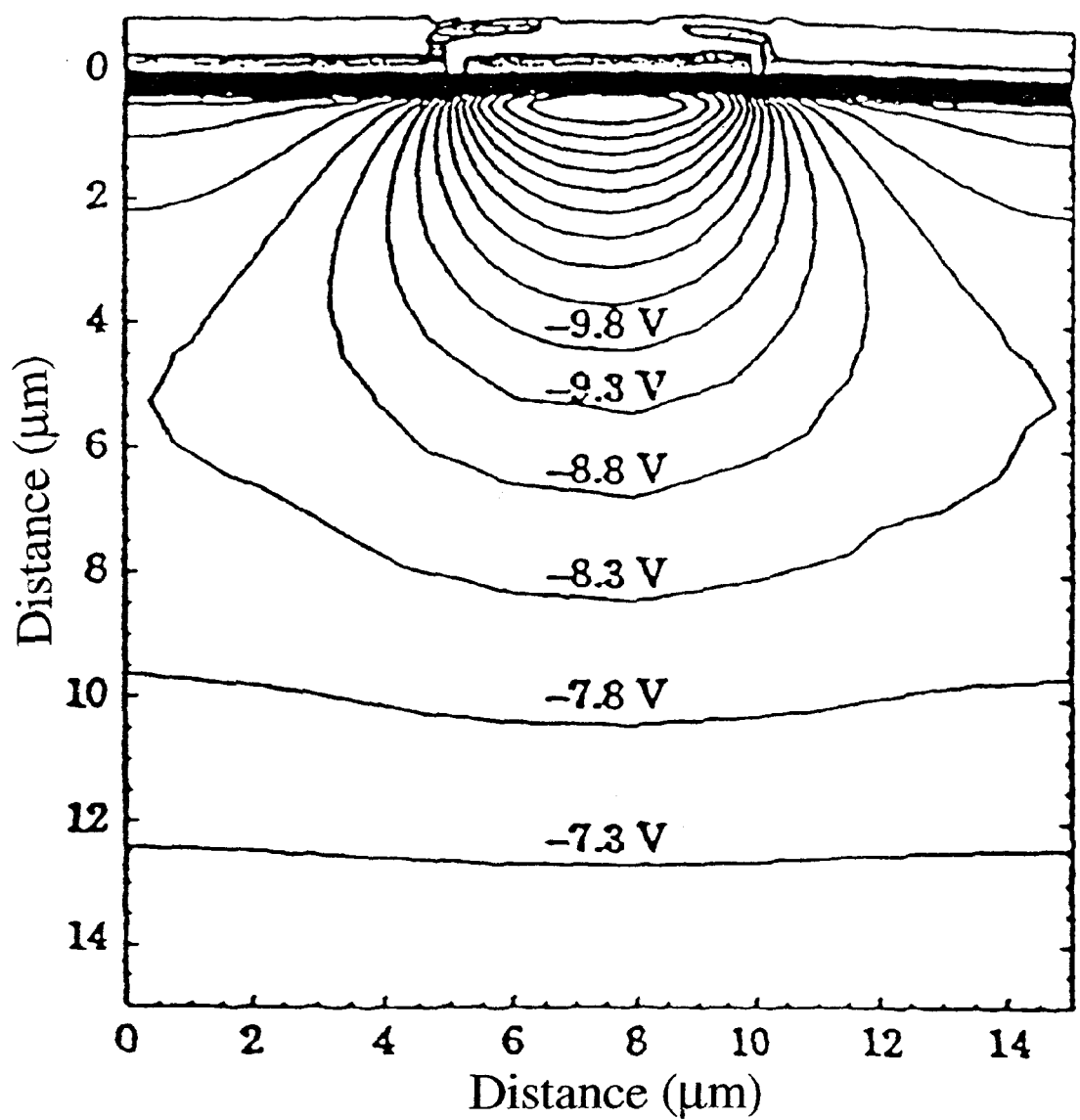

FIG. 2B: shows a two-dimensional simulation of one pixel of a CCD on high-resistivity silicon substrate, as shown in FIG. 2A. Equipotential lines are shown at a spacing of 0.5V. The collecting gate is biased a −5V and the barrier phases are at 5 V.

FIG. 2C: shows a simulated two-dimensional potential distribution for a 15 µm pixel of a CCD on high-resistivity silicon substrate, as shown in FIG. 2A. The substrate doping was $6\times10^{11}$ cm$^{-3}$ and the buried-channel implant dose was $1.5\times10^{12}$ cm$^{-2}$.

Figure 3:
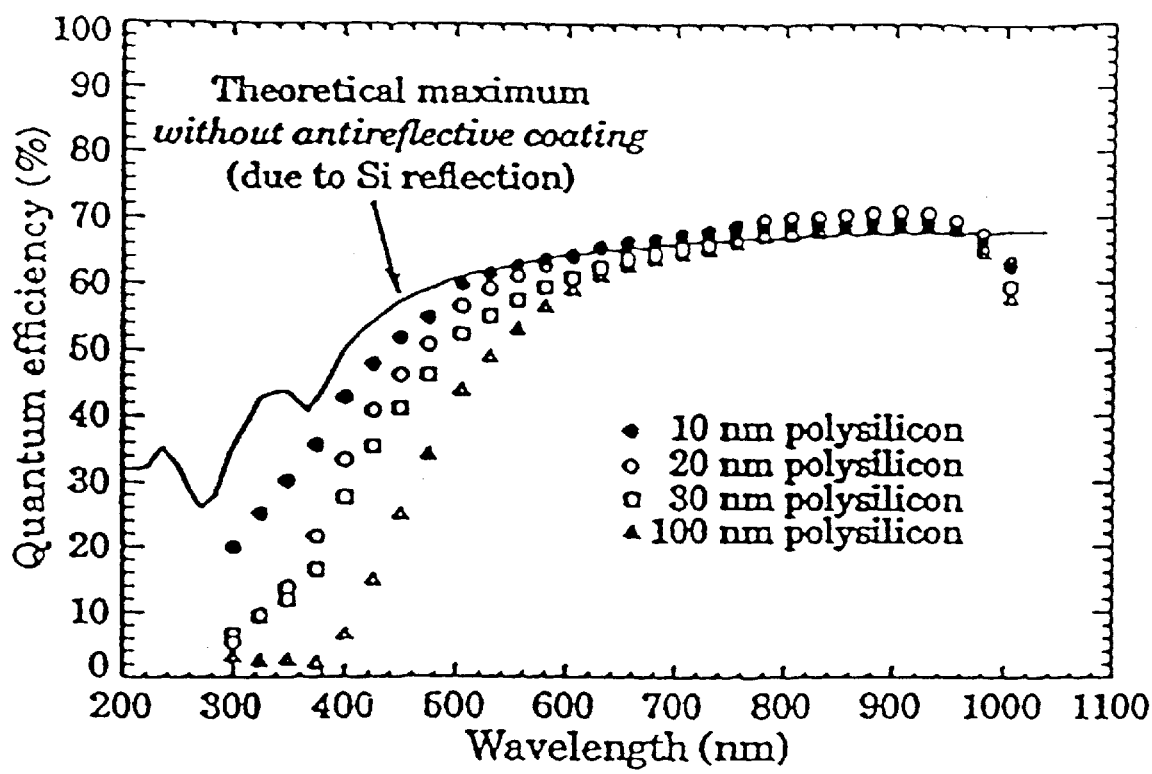

FIG. 3: shows the QE as a function of wavelength for varying thickness of the polysilicon backside layer on a 300 µm thick p-i-n photodiode.

Figure 4:
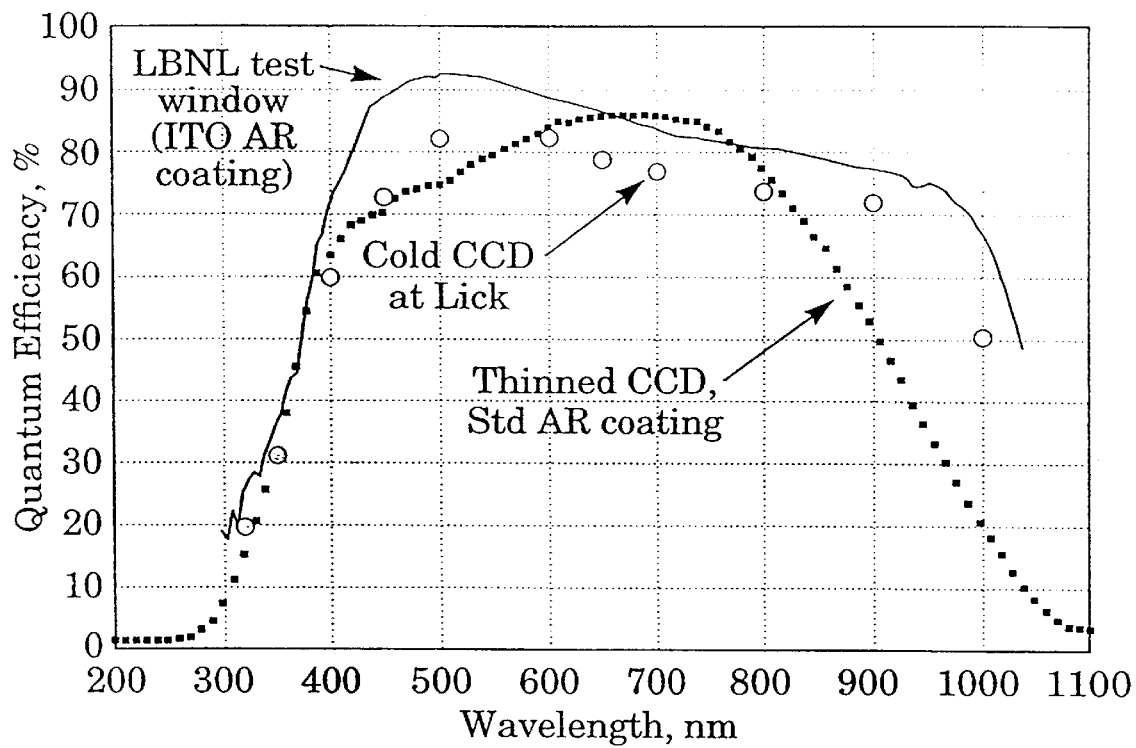

FIG. 4: shows QE as a function of wavelength for a p-i-n photodiode having a 57 nm antireflective coating on a polysilicon backside layer on a 300 µm thick substrate (solid line). Additionally, QE values as a function of wavelength are shown for an inventive backside illuminated CCD on a 300 μm thick substrate (circle data-points). For comparison, data is shown for conventional commercial CCDs having thinned substrates (broken line).

Figure 5:
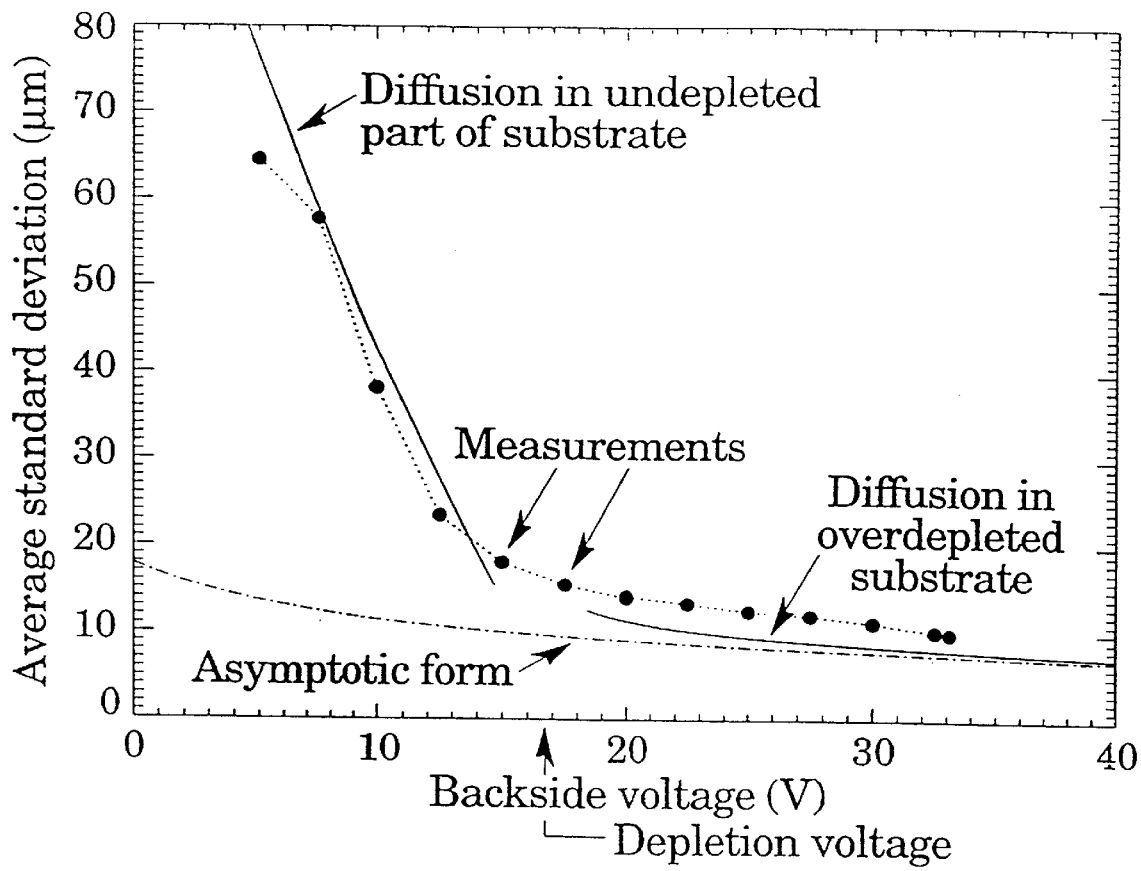

FIG. 5: shows charge diffusion, as a function of applied backside voltage in a CCD having a 300 μm thick substrate.

IV. DETAILED DESCRIPTION OF THE INVENTION

Use of the term "High Resistivity" herein means a resistivity, ρ, of between about 100 Ω-cm and 20 K Ω-cm for n-doped silicon and a resistivity, ρ, of between 100 Ω-cm and 20 K Ω-cm for p-doped silicon.

Use of the term "substrate" herein means photon-sensitive silicon, not including layers of circuitry.

Use of the term "substrate thickness" herein means the thickness of the substrate in the direction normal to the plane in which the circuitry is deposited on the frontside.

The invention comprises the combination of an electrically conducting, photon transparent, layer attached to the backside of a silicon substrate. This layer is also referred to as a backside window. The electrically conducting backside layer, or window, can be thin enough to be transparent to both long wavelength photons (such as red or infrared) and strongly absorbed short wavelength photons (such as blue and uv), as needed for the particular application. The novel combination of a thin transparent conducting layer attached to a high resistivity substrate of normal thickness, where normal thickness is that of the typically manufactured silicon wafer (i.e. between about 250 micrometers (μ) and about 550μ) provides a critical element for a new class of radiation detectors. When a bias voltage is applied between the backside and frontside of the wafer, the intervening silicon becomes fully charge depleted. Circuitry on the frontside can be used to detect photons that enter the backside and generate charge. The transparent conducting layer provides a window for back illumination of the new class of radiation detectors without requiring physical thinning of the intervening silicon substrate. When used in CCDs or active pixel sensors (an advanced CCD having amplifying circuitry on each pixel) fully-depleted high resistivity silicon having a thickness of between about 50 μm and about 550 μm can be used to increase the wavelength response of the photodetector, in the near IR region (to a wavelength of about 1μ) and in the low-energy x-ray region (to energies between about 10 and about 15 keV). Photodiodes are another type of radiation detector that benefit from use of the inventive combination.

The electrically conducting, transparent, backside layer can also be combined with lower resistivity silicon for other applications. For example, applying a conducting backside layer to a CCD having a conventionally thinned, low resistivity substrate, allows a backside voltage to be applied to the device. The applied voltage eliminates the field free region at the backside of the device. Additionally, uv charging to keep the internal fields correctly polarized (discussed in more detail below) are avoided. The applied backside voltage does that simply.

FIG. 1 schematically illustrates the inventive combination as used in a backside-illuminated p-i-n photodiode structure. Photons enter the device from the photon-transparent electrically-conducting backside layer 2. This layer also acts as an electrical contact so that a bias voltage may be placed between it and the p+ implant region 4 on the front side. The n-type silicon substrate 6 is typically a wafer as supplied by the a wafer manufacturer, having a thickness 8 between about 250 μm and about 1000 nm (or about 1 mm). The substrate can be as thick as 4 or 5 mm. The thickness of the substrate is limited by the backside voltage required to deplete the charge carriers. The depletion voltage increases as the square of the substrate thickness. Thus if the depletion voltage is about 30 V for a 300 μm thickness, it would be about 270 volts for a 1 mm thick substrate; 1 KV for a 2 mm thick substrate; and 4 KV for a 4 mm thick substrate. Depending on the application and the nature of the detection device the inventive combination is used in, a range of substrate thickness can be used. Commonly 6 inch wafers are provided having a thickness of 625 μm. Smaller diameter wafers are typically provided with smaller thicknesses, for example 550 μm or 300 μm. Larger diameter wafers may have a thickness of, for example, 750 μm. In contrast, the thickness of the p+ implant region in a photodiode is most commonly only about 1 μm (not drawn to scale in FIG. 1). Optionally an anitreflecting layer 10 is deposited on top of the backside window. It's thickness and composition are determined by well known rules for antireflective coatings. One material that has worked very well with the inventive device is indium tin oxide (ITO).

Because the backside layer is electrically conducting, applying a positive voltage to it with respect to the frontside circuitry can fully deplete the intervening substrate of charge carriers. This limits dark current to practical levels; the charge created by incoming photons is detectable over the dark current. In addition the applied voltage helps to limit a spreading of the charges created from photon absorption as they traverse the substrate thickness. So the applied voltage improves resolution as well as depleting the substrate of charge carriers other than those created by photon absorption.

FIG. 2A schematically illustrates the inventive combination as used in a backside-illuminated charge-coupled device (CCD). Photons enter the device from the photon-transparent electrically-conducting backside layer 12. This layer also acts as an electrical contact so that a bias voltage may be placed between it and the gate circuitry 14 on the front side. The n-type silicon substrate 16 is typically a wafer as supplied by the wafer manufacturer, having a thickness 18 between about 250 μm and about 1000 μm(or about 1 mm). The substrate can be as thick as 4 or 5 mm. Optionally an anitreflecting layer 20 is deposited on top of the backside window (not shown to scale). It's thickness and composition are determined by well known rules for antireflective coatings. One material that has worked very well with the inventive device is indium tin oxide (ITO).

FIG. 2B shows a two-dimensional simulation of one pixel of a CCD on high-resistivity silicon substrate, as shown in FIG. 2A. Equipotential lines are shown at a spacing of 0.5V. The collecting gate is biased a+−5V and the barrier phases are at 5 V.

FIG. 2C shows the simulated two dimensional potential distribution for a three-phase 15 μm pixel. This figure shows essentially the same data as FIG. 2B but in three dimensions instead of two. A channel implant of $1.5 \times 10^{12}$ cm$^{-2}$ was used. The substrate doping was assumed as $6 \times 10^{11}$ cm$^{-3}$ (corresponding to resistivity of about 7000 ohm-cm). The 5 μm wide collecting electrode was held at −5 V and the barrier phases were at 5 V. The backside bias voltage generated a drift field that extended to the backside electrical contact (the y dimension in FIG. 2C).

Application of a bias voltage to the backside layer is key for the operation of the inventive photon detecting element. The backside voltage fully charge depletes the photosensitive volume, limits charge spreading, and improves on-chip transistor characteristics. (see FIG. 2 of the IEDM paper cited below). However, the voltage must be well below the breakdown voltage corresponding to an electric field, which for silicon is about $2\times10^5$ V/cm at room temperature (S. M. Sze, Physics of Semiconductor Devices, 2nd Ed. , John Wiley and Sons, p. 103, 1981). High resistivity substrate, having an extremely low number of charge carriers (N) is specially manufactured so that full charge depletion can be achieved at a low backside voltage.

Because the substrate can be fully depleted of charge carriers by applying a sufficient voltage, the substrate thickness can be significantly thicker than in conventional back-illuminated CCDs. The thicker substrate has several advantages, including mechanical strength, absorption of long wavelength photons, and economy of manufacture.

The substrate thickness (8 in FIG. 1 and 18 in FIG. 2A) in the inventive combination is between about 100 µm and about 5 mm. For the three reasons of, economic manufacturing economy, mechanical strength, and ease of charge depletion, it is more preferable for the lower thickness limit of the substrate to be about 200µ. For economic manufacturing reasons, for mechanical strength, and to detect long and short wavelength photons, it is even more preferable for the lower limit of substrate thickness to be about 250µ. A substrate thickness of 10 mm is used to detect energetic x-ray photons because of their long absorption length. To the extent practical, a substrate thickness is used that is between about 2 and about 3 times the absorption length of the photon of interest. So, for example, to detect a photon in the near infrared (IR) a substrate thickness of about 300 µm works well.

The thickness of the inventive electrically-conducting photon-transparent backside layer is partly a function of the type of radiation that will be sensed by the detector. For short wavelength photons the back layer should be very thin. For long wavelength photons the backside layer may be thicker. The functional limit to the thickness of the backside layer is that it must be transparent to the incoming photon that is targeted for detection. As the backside layer is made progressively thicker, it becomes opaque to short wavelength photons.

The conducting backside layer has been made successfully having a thickness between about 10 nm and about 100 µm depending on the utility of the detector. A backside layer thickness of 100 µm is just under the silicon band gap and would only be transparent to photons having a wavelength between about 1000 nm and 1100 nm. A backside layer thickness of 10 µm is transparent to photons having a wavelength between about 800 µnm and 1100 nm. Using current deposition techniques 10 µm layer of polysilicon would take about 60 hours to deposit. More commonly inventive photon detectors are made with a backlayer that is between about 10 nm and about 1 µm. A backside layer thickness of 1 µm is transparent to photons having a wavelength between about 550 nm and 1100 nm, which includes red and infra-red. A backside layer that is between 10 nm and 100 nm is transparent to blue photons as well as longer wavelength photons and several devices having backside layers in this thickness range have been made. The most useful range of backside layer thicknesses is between about 10 nm and about 50 nm because that is transparent to both short and long wavelength photons and the time required for the deposition step is shorter than for the thicker backside layers.

The photon absorption length in silicon is temperature dependent, with absorption length increasing with decreasing temperature. If a substrate thickness is more than 2 or 3 times the absorption length of the detected photon, excessive backside voltage may be required for charge depletion. The backside voltage required to for full charge depletion increases as the square of the substrate thickness. In addition, there is some loss in resolution when the substrate thickness is larger than necessary to absorb the photon.

It is important to maintain a low dark current for photodetectors. One way to keep the dark current low is by using an in-situ doped CVD backside layer that does not increase the dark current.

The polysilicon layer is in-situ doped to be electrically conducting. Doping is the addition of elements to the polysilicon that increase the electrical conductivity. The window layer is optically thin to be transparent to short-wavelength light which has a small absorption depth in silicon.

There are various ways to dope polysilicon. Use of CVD keeps the n+ layer on the back thin, which is necessary for good short wavelength light absorption. Another method of doping is ion implantation of the dopants, but existing implanters could not easily implant such a thin layer (100A). Additionally, ion implantation requires thermal cycling that could increase the dark current. Yet another doping technique is doping by thermal diffusion but it has the same problems as just mentioned.

Another technique that can be used to dope a thin backside layer is molecular beam epitaxy, which however is very expensive. If expense is not an issue there may be some advantages to doing it that way.

The inventive combination has particularly good long-wavelength response because the silicon wafer does not need to be thinned. Because the active volume (the thickness of the silicon wafer) is much thicker than typical CCDs or other sensors, long-wavelength photons such as those in the infrared region are absorbed in the active volume of the silicon and generate charge carriers instead of passing through.

The thin backside polysilicon layer acts as a transparent electrical contact that allows for application of a bias voltage to deplete the substrate. Because of the large refractive index of silicon (3.7), the layer has fairly high reflectivity. For example, reflectivity is 33% at long wavelengths and even more at short wavelengths. Application of a conducting coating that reduces reflectivity of the backside window layer increases the quantum efficiency of the inventive combination.

The inventive combination of transparent low-resistivity backside layer and silicon wafer is additionally combined with an antireflecting layer (10 in FIG. 1 or 20 in FIG. 2). Preferably, the antireflecting layer is electrically conducting and transparent, for example, indium tin oxide (ITO). Coating the in-situ doped polysilicon with ITO leads to less reflection loss and thus better quantum efficiency. Using a conducting outer layer additionally decreases series resistance thus making a lower noise device. A reduction in dark current of about a factor of two was observed when an ITO coating was applied to the combined backside layer and silicon wafer.

The ITO layer was deposited by reactive sputtering. Ionized argon atoms are attracted to a biased ITO target and sublimate off ITO molecules. The molecules are deposited on the backside layer of the substrate by locating it directly across from the ITO target.

A major advantage of the inventive combination is that the backside window layer is transparent to full spectrum of photons, from uv through IR and including x-rays, which can enter the active silicon volume 6 and create charge carriers. Applying the backside window to a relatively thick silicon wafer has several advantages.

- The thick device is not susceptible to warpage like thinned devices are.
- A voltage can be applied to the backside layer that gives a fully charge depleted device, with essentially no field-free region near the backside contact (such a field free region would result in an undesirable significant charge diffusion).
- Fringing in the red, which is a problem with thinned devices, is eliminated.
- A detector device employing the inventive combination can be back-illuminated with corresponding good blue response without the need for thinning.
- The active volume is not transparent to long-wavelength photons.

While the thickness of the active silicon volume can be chosen to absorb, and thus detect, long-wavelength photons, that same thickness can lead to loss of charge carriers created by short-wavelength photons, for example in the blue or uv region. To aid in the detection of short-wavelength photons, a voltage is applied between the conducting backside window layer (or optional ITO coating) and the p+ region of a photodiode. In the case of a CCD or active pixel sensor, the voltage is applied between the conducting backside window layer (optionally having an ITO and/or other antireflective coating(s)) and a polysilicon gate. The gate electrodes result in a voltage drop across the buried channels, and the difference between the voltage at the buried channel junction and the backside voltage determines the electric field that the carriers drift through (S. Holland et al. "Development of back-illuminated, fully-depleted CCD image sensors for use in astronomy and astrophysics", IEEE Workshop on Charge-Coupled Devices & Advanced Image Sensors, Bruge, Belgium, Jun. 5–7, 1997).

The polysilicon layer can withstand bias voltages necessary to fully deplete a high-resistivity substrate without causing significant increases in dark current. The bias voltage causes the small number of mobile electrons in the high-resistivity n-type substrate to be removed, leaving behind ionized donor atoms which result in the electric field necessary to collect the photogenerated charges before they recombine or diffuse out, which would cause a loss of spatial resolution.

One problem that can arise when a voltage bias is applied between the back and front of a silicon photo device is that a voltage breakdown between pixels and isolating structures such as channel stop implants for CCDs can occur. CCD columns are isolated from another with a channel stop implant, which is an ion implant resulting in a larger concentration of dopant impurities at the surface of the CCD than in the bulk. The effect is to raise the potential barrier between adjacent columns.

If these regions are electrically floating in the CCD, high electric fields will develop between the CCD channel and channel stop implant, which could lead to breakdown. Because of the depleted CCD channel the potential in the channel is typically 5–10V more negative than the applied gate voltage. The channel stop implant tends to float up to some fraction of the applied substrate bias, which is positive for an n-type substrate. Hence a large potential difference between the CCD channel and channel stop implant can develop.

Application of a bias voltage between the backside window and the frontside of a photon detection device creates a fully charge depleted photon sensitive volume. It also improves spatial resolution by limiting the charge spread, or bloom, as the photon created charge carriers move toward the front side of the detector.

In order to avoid breakdown a small gap of unimplanted silicon is left between the channel and channel stop implant. Because this region is lightly doped the fields are reduced and breakdown is avoided.

Many of the present embodiments (for example, CCDs, photodiodes, active pixel sensors) use n-type substrates, however this technique has also been applied to radiation detectors fabricated on p-type silicon. In that case an isolating implant is required to compensate for the fixed charge in the silicon dioxide layer over the silicon. If not present the fixed charge, which is always positively charged, will cause an inversion layer of electrons that can short-circuit adjacent elements.

The bias voltage $V_B$ is chosen based on several factors, including the resistance of the photon-sensitive silicon volume.

The minimum bias voltage that can be used, $V_{B-MIN}$ is equal to the depletion voltage. From a practical point of view, however, one uses a $V_B$ somewhat higher than the depletion voltage. We used as a rule of thumb, a $V_B = V_{B-MIN} + X\%$ ($V_{B-MIN}$), where X=the variation in N (the number of dopant atoms per cm$^3$ in the depleted region). For resistances of about 10–12 KΩ-cm in the silicon substrate, a $V_B$=35V was frequently used. The maximum $V_B$ is limited by the presence of secondary carriers from impact ionization of the primary charge carriers; this phenomena is observed by increased noise and voltage breakdown.

Depletion voltage $V_D$ is given by $$V_D = (0.5 \ q \ N(x_D)^2)/\epsilon_s$$

where N is the number of dopant atoms per cm$^3$ in the depleted region, $x_D$ is the length of the depleted region, q is the electronic charge (1.602×10$^{-19}$ C), and $\epsilon_s$ is the permittivity of silicon (1.0×10$^{-12}$ F./cm). N is related to resistivity by $$\rho = (q \ \mu N)^{-1}$$

where $\rho$ is resistivity and $\mu$ is carrier mobility (note that for lightly doped material the electron mobility is 3× that of hole mobility. Hence for the same resistivity, N is actually 3× less for n-type silicon when compared to p-type silicon).

Since the depletion voltage goes as the square of $x_D$, one requires small N in order to keep the depletion voltage to a reasonable value. Large $x_D$ allows for better near-IR response and with small N one can have the best of both worlds, good near-IR and the ability to back-illuminate with reasonable substrate voltages.

Table I compares $\rho$ and N for various high-resistivity CCDs (assuming about 500 cm$^2$/V-sec for hole mobility, and 1500 cm$^2$/V-sec for electron mobility):

TABLE I

| Researchers | Substrate doping | $\rho$ | N | epi ? | Reported $x_p$ |
|---|---|---|---|---|---|
| Lincoln1 | p | 6.5K | 1.9 × 10$^{12}$ | no | 50 μm |
| Lincoln2 | p | 1.0K | 1.3 × 10$^{13}$ | no | ? |

TABLE I-continued

| Researchers | Substrate doping | ρ | N | epi ? | Reported $x_p$ |
|---|---|---|---|---|---|
| Lincoln3 | p | 5–10K | $1.3 \times 10_{12}$ | no | >50 μm |
| NorthernTele | p | 1–5K | $2.5 \times 10^{12}$ | no | >50 μm |
| Leicester | p | 8K | $1.5 \times 10^{12}$ | no | 80 μm |
| Dalsa | p | 1K | $1.3 \times 10^{13}$ | yes | 40 μm |
| MPI | n | 2.5K | $1.7 \times 10^{12}$ | yes | 300 μm |
| Westinghouse | n | 15K | $2.8 \times 10^{11}$ | no | 250 μm |
| Present Invention | n | >10K | $<4.1 \times 10^{11}$ | no | 300 μm |

Extremely low N is needed to deplete a substrate of between 100 μm and 1000 μm with reasonable voltages. As the table above shows, the present invention has been fabricated having sufficiently low N. The other substrate, developed by Westinghouse researchers, having low N, exhibited excessively high dark currents, much higher than could be used in a useful device. Generally, other things being equal, the lower the N, the better the performance of the inventive device (D. M. McCann et al., "Area array x-ray sensors," Advances in Focal Plane Technology, Proc. of SPIE, 217, pp. 118–128, 198).

The advantage to using low N is that the substrate can be depleted with relatively low voltages (about 20–25V). This makes the breakdown problem less likely and decreases concern over problems with either or both of the CCD pixels or output amplifier. Both concerns are due to the strongly two-dimensional nature of the fields for extremely low N. Transistor and CCD properties improve with increasing backside voltage, provided the voltage remains less than breakdown voltage. The strong two-dimensional nature of the fields and the backside voltage tend to somewhat flatten the two-dimensional fields. The effect of backside voltage on CCD output transistor characteristics is discussed in S. Holland et al., "A 200×200 CCD Image Sensor fabricated on high-resistivity silicon", International Electron Devices Meeting (IEDM) Technical Digest, pp 911–14, 1996, San Francisco Calif.

In order to obtain high resistivity silicon with sufficiently low N, a custom order was placed with Wacker-Chemtronic in Germany. The specifications supplied to the German company is given in the examples below. W. Von Ammon and H. Herzer discuss the fabrication of low N, high resistivity, substrate in their paper, "The production and availability of high resistivity silicon for detector applications", Nuclear Instruments and Methods in Physics Research, A226, pp 94–102, 1984.

For the output transistor, punch-through is a concern and for the CCD pixels the ability to form potential wells and store charge is a concern. One could have poor isolation between pixels along the channel with charge spilling over from one pixel to another (not affected by channel stop implant, which isolates channels from each other).

The reflection loss can be decreased by using antireflection coatings. Silicon dioxide (an insulator with refractive index 1.45) and indium tin oxide (a conductor which is also transparent and has a refractive index of 1.8–2.2) have been successfully used. There are many others that can be used.

For photodiodes used in positron emission tomography (PET) the ITO thickness was tuned to the desired wavelength where the scintillating crystals emitted photons of a particular wavelength (S. Holland et al., Development of low noise, backside illuminated silicon photodiode arrays", IEEE Transaction on Nuclear Science, 44(3); 443–7, June 1997). About a quarter wavelength thickness of ITO was deposited. Another approach is to use two coatings for antireflective properties, an underlayer of ITO and a top layer of silicon dioxide. Techniques of antireflective coatings are well developed and can be applied to the backside window of the inventive combination. Two sources of such materials and discussion is a paper by M. Blouke and M. D. Nelson, "Stable ultraviolet antireflection coatings for charge-coupled devices", SPIE 1900; 228–240, 1993 and a paper by M. Lesser, "Antireflection coatings for silicon charge-coupled devices", Optical Engineering, 26(9), 911–915, 1987.

Films made from a class of materials referred to as transparent conducting oxides (TCOs) would provide alternative materials to ITO and would have similar properties. In general, any film that has a low refractive index can be used as an antireflection coating, although a highly resistive layer could result in an undesirably nonuniform backside voltage under some circumstances, for example with a very bright image. Other candidate materials for antireflection coatings include, hafnium oxide, lead oxide, aluminum oxide, silicon nitride, and magnesium fluoride.

Indium tin oxide has many advantages:

1) It is conducting and reduces the resistance of the thin backside layer (important for noise considerations in the case of a photodiode and for creating an equipotential on the back surface for the CCD).

2) The refractive index is a good match for an air/ITO/silicon interface (theoretical zero reflectivity at a wavelength corresponding to a quarter-wave plate when the intermediate film has a refractive index that is the geometric mean between air and silicon). This is discussed in detail in the IEEE Nuclear Science paper cited above.

3) It is deposited at room temperature and doesn't degrade the leakage current.

4) Since it is conducting, the physical backside contact is simple to make.

An insulating layer such as MgF is compatible with the thin polysilicon backside are multi-layer coatings. However if an insulating material is used as an antireflective layer, part of the insulator would have to be removed in order to make backside contact, or the voltage can be applied to the frontside and the backside allowed to float.

A CCD fabricated using high resistivity silicon substrate as the photon sensitive volume is one aspect of the present invention. It is surprising that a CCD fabricated with such high resistivity silicon works usefully, with or without the electrically conducting layer on the backside. The high-resistivity volume makes the potentials strongly two-dimensional and many people expected that potential wells wouldn't form functionally in such high-resistivity material. Pixels were made as small as 15×15 μm² on the inventive device. It was unexpected that we would be able to make such small pixels on high-resistivity material. Commercial devices on lower resistivity silicon had pixel sizes of either 27×27 μm² or 18×24 μm².

The backside layer is doped to between about 0.0001 to about 10 atomic percent doping with phosphorous. More preferably it is doped to between about 0.001 to about 3 atomic percent with phosphorous. Most preferably it is doped to between about 0.1 to about 3 atomic percent with phosphorous. Working models have been constructed using about 1 and about 1.5 atomic percent phosphorous doping, without annealing. This is described in more detail in the IEEE Transaction on Nuclear Science paper cited above.

Surface pinning: The dark current in the CCD has both a bulk component and a surface component. The effective gettering from the phosphorus-doped polysilicon layer greatly reduces the bulk component, leaving the surface component as the dominant source of dark current.

Techniques for reducing the surface current involve filling the interface states at the surface with carriers supplied from the channel stop implant. The polysilicon gate electrode on the front of the device is biased so that an inversion layer of carriers is created, filling the surface states. Once filled the states no longer contribute to the dark current. The high concentration of mobile carriers at the surface pins the potential, hence the term surface pinning. This technique requires that the channel stop implant be biased (typically at ground potential).

For the fully-depleted CCD there can be an ohmic path between the bias applied at the backside window and the channel stop contact external to the CCD itself, resulting in a large current flowing between the backside and the channel stop. Using simple diode structures having a proper geometry (that is, the n+ contact on the front surface must be surrounded by p+ or CCD pixels on both sides) the channel stop current is reduced. This geometric design reverse-biases the channel stop via nearby p-n junctions. Similar modifications in geometries were implemented in a CCD design.

There is another technique that significantly reduced the surface currents when used in conjunction with the above described CCD geometry. The long emission time at low temperatures traps carriers in the surface states. First, carriers are allowed to fill the surface states under conditions where the channel stop is connected and all CCD gates were held at a potential sufficient to invert the surface carrier type. Then the channel stop contact was floated and the long emission time constant kept the surface current low during the operation of the CCD.

Unreliable techniques such as UV charging to keep the fields pointing in the right direction on the backside are avoided using the present invention because a voltage applied to the backside layer of the present invention eliminates this problem (S. Holland et al., "A 200×200 CCD Image Sensor fabricated on high-resistivity silicon", International Electron Devices Meeting Technical Digest, pp 911–14, 1996, San Francisco Calif.).

The problem is that a native oxide naturally forms on silicon. Oxides on silicon always have a fixed positive charge at the interface. For conventionally used p-type silicon this positive charge forms a small depletion layer at the back surface. For short wavelength photons the generated electrons are attracted by the fixed charge towards the back surface. A solution is UV charging of the back surface to create a surface layer of electrons to overcome the fixed positive charge. Another technique is the flash gate where the workfunction of the thin transparent gate overcomes the positive charge.

In another attempt to solve this problem, RCA researchers made a conventional low resistivity CCD on n-type silicon where the positive charge repelled the holes towards the potential wells. Using the present invention, when a backside voltage is applied the problem disappears. Even if a CCD was made on p-type substrate, using the present invention a backside voltage large enough to deplete the substrate of charges would more than compensate for the positive charge.

There are several critical parameters associated with the inventive radiation sensitive device.

The backside layer is doped to between about 0.0001 to about 10 atomic percent doping with phosphorous. More preferably it is doped to between about 0.001 to about 3 atomic percent with phosphorous. Most preferably it is doped to between about 0.1 to about 3 atomic percent with phosphorous. Working models have been constructed using about 1 atomic percent phosphorous doping, without annealing.

For n-type substrate, the resistivity of substrate used for the photon sensitive volume can be between about 100 Ω-cm and about 20 KΩ-cm. More preferably it is between about 6 KΩ-cm and about 12 KΩ-cm.

For p-type substrate, the resistivity of silicon substrate used for the photon sensitive volume can be between about 100 KΩ-cm and about 20 KΩ-cm. More preferably it is between about 6 KΩ-cm and about 15 KΩ-cm.

The bias voltage applied between the inventive electrically conducting backside layer and a conductive region on the frontside of the photon-sensitive silicon volume is limited at the upper end by voltage breakdown across the silicon volume and at the lower end by the carrier velocity generated by the bias. The carrier velocity across the silicon volume should be great enough to overcome radial carrier motion due to thermal diffusion.

As resistivity (of the silicon substrate used for the photon sensitive volume) decreases, the voltage required for full depletion decreases. When the photosensitive volume silicon becomes too low in resistance, the bias voltage causes breakdown or excessive noise before the states are depleted.

As resistivity (of the silicon substrate used for the photon sensitive volume) increases, the potential well geometry under the CCD gates becomes more two dimensional and transistor characteristics degrade. This phenomena limits the maximum resistivity that can be used for the silicon substrate. The 2-dimensional effect can be partially compensated by increasing the backside voltage. When the backside voltage exceeds the depletion voltage, two terms describe the electric field (see equation 2 in the 1997 IEEE Belgium Workshop paper referenced above). When N is very small, $V_{appl}/Y_d$ dominates and the value of N becomes unimportant. A number of 2-dimensional simulations were performed to compare the full well capacity of a high resistivity CCD with a low resistivity CCD (about 20 ohm-cm). Surprisingly, no difference was seen in full well capacity between the two resistivity states, in spite of earlier reports to the contrary. The flattening of the well was probably compensated by the backside voltage.

The thickness of the inventive electrically conducting backside layer is partly a function of the type of radiation that will be sensed by the detector. For short wavelength photons the back layer should be very thin. For long wavelength photons the backside layer may be thicker. The functional limit to the thickness of the backside layer is that it must be transparent to the incoming photon that is targeted for detection. As the backside layer is made progressively thicker, it becomes opaque to short wavelength photons. The backside layer has been made successfully having a thickness between about 10 nm and about 1000 µm depending on the utility of the detector. More preferably, to minimize leakage current, the backlayer is between about 10 nm and about 100 µm. Most commonly we have used the detector with a backlayer that is between about 10 nm and about 1 µm.

EXAMPLE 1
Fabrication of Backside Window

The inventive backside window is deposited by low pressure chemical vapor deposition (CVD) of silane ($SiH_4$) in the presence of phosphine ($PH_3$) on to a high resistivity silicon substrate. The process is performed at low temperatures, about 650° C., and is performed under extremely clean conditions; impurities are kept to less than parts per billion. Because it is a low temperature step, deposition of the polycrystalline silicon (polysilicon) layer is done near the end of the processing, after all the high temperature processing is complete. The process protocols below illustrate one sequence for applying the window. The vacuum chamber sidewalls are covered with polysilicon that deposits on the chamber walls. Gasses used are pure to 99.999%. The silicon wafers are precleaned by exacting, if generally accepted, protocol. The substrate is put through a gettering process before the backside window is deposited. A thick, phosphorus doped polysilicon is used for gettering, and then is etched off before the backside window is deposited. The gettering step is performed according to a method published by S. Holland in Nuclear Instruments and Methods in Physics Research, A275,537–541, 1989, entitled, "Fabrication of detectors and transistors on high-resistivity silicon". This process gives a substrate that is essentially free of metallic contaminants.

The backside layer is doped to between about 0.0001 to about 10 atomic percent doping with phosphorous. More preferably it is doped to between about 0.001 to about 3 atomic percent with phosphorous. Most preferably it is doped to between about 0.1 to about 3 atomic percent with phosphorous. Working models have been constructed using about 1 atomic percent phosphorous doping, without annealing.

Basically, deposition of the thin backside polysilicon window is performed by the following steps:
   a. Standard prediffusion clean with the addition of a final dilute HF etch followed by DI rinse.
   b. LPCVD of doped polysilicon on wafer backside using Thermco recipe DPOLY.
   c. Measure polysilicon thickness on monitor wafers.

The process is performed at about 650° C., 400 milliTorr pressure, using a gas flow of 1% $PH_3$ in $SiH_4$.

EXAMPLE 2
Obtaining Low N Substrate

To obtain the desired high-resistivity, low N, silicon wafers bids were obtained from several candidate wafer makers. The wafers used for most of the experiments described herein were custom ordered from Wacker Siltronic Corporation, Regional Sales Office, 4010 Moorpark Ave., #114, San Jose, Calif. 95117, at 408/554-9728. The wafers were made according to the following specifications:
1. Type: n-type, phosphorus doped, float-zone refined, dislocation free.
2. Crystalline orientation: <100>
3. Resistivity: Greater than 6000 Ω-cm, preferably close to 10,000 Ω-cm.
4. Minority carrier lifetime: Greater than 1 millisecond.
5. Diameter; 100 mm.
6. Nominal thickness: 300 µm.
7. Flat: According to SEMI standard.
8. Edge: Edge rounding to minimize edge cracking during handling which could lead to wafer breakage.
9. Wafer finish: polished one side, other side damage free, i.e. no intentional damage or gettering on the backside.
10. Thickness tolerance: ±15 µm maximum
11. Taper: <5 µm maximum.
12. Bow: <30 µm maximum.
13. Quantity: 500 wafers.

EXAMPLE 3
Making a Photodiode having an Electrically Conducting, Photon Transparent, Backside Layer The following process flow was used to fabricate backside-illuminated photodiodes on n-type substrates, having an electrically conducting, photon transparent, polysilicon layer on the backside. Updated protocols are available from the inventor at Lawrence Berkeley National Laboratory in Berkeley, Calif.; Telephone number: 510 486-4000.

Starting material: silicon wafer for substrate having: resistance greater than 4 kΩ-cm, 300 µm thick, <100> n-type silicon (custom ordered from Wacker).

(1) Low-temperature oxide deposition
   a. Standard prediffusion clean:
      5 minute piranha at 110 C. (WPS 2)
      DI water rinse (WPS 2)
      Dilute HF etch (WPS 2)
      DI water rinse (WPS 2)
      5 minute megasonic RCA I clean at 40 C. (WPS 2)
      DI water rinse (WPS 2)
      Dilute HF etch (WPS 2)
      DI water rinse (WPS 1)
      5 minute megasonic RCA II clean at 40 C. (WPS 1)
      DI water rinse (WPS 1)
   b. LPCVD of 5000A of $SiO_2$, 30 minute deposition at 425 C. using Thermco recipe UDLTO.
   c. Measure oxide thickness on monitor wafers.
(2) Backside oxide removal
   a. Prime wafers in LP3 (HMDS application).
   b. Spin OCG825 photoresist (MTI recipe #1).
   c. Hard bake wafers for 30 minutes at 120 C.
   d. Etch wafers in 6:1 buffered oxide etch (BOE) until the backside oxide is completely removed.
   e. Strip resist in piranha (WPS 5).
(3) 1 µm in-situ doped polysilicon deposition
   a. Standard prediffusion clean with the addition of a final dilute HF etch followed by DI rinse.
   b. LPCVD of doped polysilicon on wafer backside, approximately 6 hour deposition using Thermco recipe DPOLY.
   c. Measure polysilicon thickness on monitor wafers.
(4) 1000A nitride deposition
   a. Prediffusion clean not required if wafers are immediately loaded into nitride tube following doped polysilicon deposition.
   b. LPCVD of 1000A of silicon nitride on wafer backside, 47 minute deposition using Thermco recipe NITRIDE.
(5) Frontside nitride/poly removal
   a. Plasma etch frontside nitride/poly using technics-c etcher on campus. 100 W, 280 mtorr, 13 sccm $SF_6$, 21 sccm He.
(6) Frontside LTO removal
   a. Etch frontside LTO in BOE.
(7) 4000A field oxidation
   a. Standard prediffusion clean:
   b. Steam oxidation to grow 4000A field oxide, 4 hours 45 min at 900 C. using Thermco recipe WET4000A, tube 2-1, with TCA clean of furnace tube prior to oxidation using Thermco recipe 1TCACLN.

c. Measure oxide thickness on monitor wafers.

(8) Mask 1 ($p^+$ implant)

a. Prime wafers in LP3 (HMDS application).

b. Spin OCG825 photoresist (MTI recipe #1).

c. Expose using Mask 1 (0.6 second exposure).

d. Develop in 3:1 DI water: OCG809 (WPS 3).

e. Inspect.

(9) Oxide etch a. Hard bake wafers for 30 minutes at 120 C.

b. Determine etch rate of 6:1 buffered oxide etch (BOE) rate using 1000A thermal oxide test wafer.

c. Based on BOE etch rate and measured thickness calculated the required etch time. Etch wafers for this amount of time plus 20%, in addition to any time that may be required for wetting.

d. After DI water rinse inspect for hydrophobic surface behavior on large etched areas. Measure remaining oxide thickness on nanospec to verify complete oxide removal.

e. Strip resist in piranha (WPS 5).

(10) Boron implant a. $B^+$, dose of $2 \, 10^{15}$ $cm^{-2}$, energy of 30 keV, tilt angle of 7 degrees.

(11) 1000A thermal oxidation/implant anneal a. Standard prediffusion clean:

b. Steam oxidation to grow 1000A field oxide (37 minutes at 900 C.) followed by 2 hour nitrogen anneal, Thermco recipe W1000 DET, tube 2-1, with TCA clean of furnace tube prior to oxidation using Thermco recipe 1TCACLN.

c. Measure oxide thickness on monitor wafers.

(12) Backside oxynitride/nitride removal a. Prime wafers in LP3 (HMDS application).

b. Spin OCG825 photoresist (MTI recipe #1).

c. Hard bake wafers for 30 minutes at 120 C.

d. Etch wafers in 6:1 buffered oxide etch (BOE) for 3 minutes to remove backside oxynitride.

e. Strip resist in piranha (WPS 5).

f. Remove backside nitride in phosphoric acid at 190 C.

(13) Backside polysilicon removal a. Prime wafers in LP3 (HMDS application).

b. Spin OCG825 photoresist (MTI recipe #1).

c. Hard bake wafers for 30 minutes at 120 C.

d. Etch wafers in silicon etch until the backside polysilicon and diffused $n^+$ layer is removed. Use monitor wafers from backside poly deposition to determine approximate etch time, and verify removal with 4-point probe measurements on wafer backside.

(14) Thin backside polysilicon deposition a. Standard prediffusion clean with the addition of a final dilute HF etch followed by DI rinse.

b. LPCVD of doped polysilicon on wafer backside using Thermco recipe DPOLY.

c. Measure polysilicon thickness on monitor wafers.

(15) Frontside polysilicon removal a. Plasma etch frontside polysilicon using technics-c etcher on campus. 100 W, 280 mtorr, 13 sccm $SF_6$, 21 sccm He. Minimize over-etching due to the relatively poor selectivity of this etch to oxide.

b. Clean wafers in piranha (wps 5).

(16) Mask 2 (contact mask)

a. Prime wafers in LP3 (HMDS application).

b. Spin OCG825 photoresist (MTI recipe #1).

c. Expose using Mask 4 (0.6 second exposure).

d. Develop in 3:1 DI water: OCG809 (WPS 3).

e. Inspect.

(17) Contact etch a. Hard bake wafers for 30 minutes at 120 C.

b. Determine etch rate of 6:1 buffered oxide etch (BOE) rate using low-temperature oxide monitor wafers.

c. Based on BOE etch rate and measured thickness calculate the required etch time. Etch wafers for this amount of time plus 20%, in addition to any time that may be required for wetting.

d. After DI water rinse inspect for hydrophobic surface behavior on large etched areas. Measure remaining oxide thickness on nanospec to verify complete oxide removal.

e. Strip resist in piranha (WPS 5).

(18) 0.5 $\mu m$ aluminum deposition a. Determine etch rate of dilute HF bath.

b. Based on etch rate measurement, etch to remove 60A of oxide.

c. Load wafers into MRC603.

d. Sputter aluminum at 6 kW, 15 cm/min, 10 mtorr.

(19) Mask 5 (metal mask)

a. Prime wafers in LP3 (HMDS application).

b. Spin OCG825 photoresist (MTI recipe #1).

c. Expose using Mask 5 (0.6 second exposure).

d. Develop in 3:1 DI water: OCG809 (WPS 3).

e. Inspect.

(20) Metal etch a. Hard bake wafers for 30 minutes at 120 C.

b. Etch wafers in aluminum etchant at 30 C.

c. Remove silicon residue in campus technics-c plasma etcher.

d. Strip resist in PRS-2000.

(21) Sinter a. Sinter at 400 C. in forming gas using Thermco recipe SINT400, tube 1-2.

(22) Backside ITO deposition/anneal

See Example 5.

EXAMPLE 4

CCD

The following process flow was used to fabricate backside-illuminated charged-coupled devices on n-type substrates, having an electrically conducting, photon transparent, polysilicon layer on the backside:

Starting material: silicon wafer for substrate having: resistance greater than 4 k$\Omega$-cm, 300 $\mu m$ thick, <100> n-type silicon (custom ordered from Wacker).

(1) Low-temperature oxide deposition a. Standard prediffusion clean:

5 minute piranha at 100 C. (WPS 2)

DI water rinse (WPS 2)

Dilute HF etch (WPS 2)

DI water rinse (WPS 2)

5 minute megasonic RCA I clean at 45 C. (WPS 2)

DI water rinse (WPS 2)

Dilute HF etch (WPS 2)

DI water rinse (WPS 1)

5 minute megasonic RCA II clean at 45 C. (WPS 1)
DI water rinse (WPS 1)
b. LPCVD of 5000A of $SiO_2$, 30 minute deposition at 425 C. using Thermco recipe UDLTO.
c. Measure oxide thickness on monitor wafers.

(2) Backside oxide removal
a. Prime wafers in LP3 (HMDS application).
b. Spin OCG825 photoresist (MTI recipe #1).
c. Hard bake wafers for 30 minutes at 120 C.
d. Recoat with OCG825 photoresist (MTI recipe #1).
e. Hard bake wafers for 30 minutes at 120 C.
f. Etch wafers in 6:1 buffered oxide etch (BOE) until the backside oxide is completely removed.
g. Strip resist in piranha (WPS 5).

(3) 1 $\mu$m in-situ doped polysilicon deposition
a. Standard prediffusion clean with the addition of a final dilute HF etch followed by DI rinse.
b. LPCVD of doped polysilicon on wafer backside, approximately 6 hour deposition using Thermco recipe DPOLY.
c. Measure polysilicon thickness on monitor wafers.

(4) 1000A nitride deposition
a. Prediffusion clean not required if wafers are immediately loaded into nitride tube following doped polysilicon deposition.
b. LPCVD of 1000A of silicon nitride on wafer backside, 47 minute deposition using Thermco recipe NITRIDE.

(5) Frontside nitride/poly removal
a. Plasma etch frontside nitride/poly using technics-c etcher on campus. 100 W, 280 mtorr, 13 sccm $SF_6$, 21 sccm He.

(6) Frontside LTO removal
a. Etch frontside LTO in BOE.

(7) 500A gate oxidation
a. Standard prediffusion clean:
b. Dry oxidation in TCA to grow 500A gate oxide, 3 hours 45 minutes at 900 C. using Thermco recipe D200GATW, tube 2—2, with TCA clean of furnace tube prior to oxidation using Thermco recipe 1TCA-CLN.
c. Measure oxide thickness on monitor wafers.
d. Load wafers immediately into nitride furnace.

(8) 500A gate nitride deposition
a. No clean necessary as wafers loaded directly from gate oxidation furnace.
b. Nitride deposition of 500A, 20.5 minute deposition using Thermco recipe NITCCD, tube 2-4.
c. Measure nitride thickness on monitor wafers. (9) Mask 1 (active area mask)
a. Prime wafers in LP3 (HMDS application).
b. Spin OCG825 photoresist (MTI recipe #1).
c. Expose using Mask 4 (0.6 second exposure).
d. Develop in 3:1 DI water: OCG809 (WPS 3).
e. Inspect.

(10) Nitride etch
a. Hard bake wafers for 30 minutes at 120 C.
b. Etch nitride using technics-c plasma etcher on campus. Determine approximate etch time, etch for one half this amount, rotate wafers 180 degrees and etch the remaining time (improves etch uniformity).
c. Do not remove resist.

(11) Field implant (phosphorus)
a. Dose of $1 \cdot 10^{12}$ $cm^{-2}$, energy of 150 keV (projected range of approximately 0.15 $\mu$m), tilt angle of 7 degrees (target: 250V field threshold voltage with 0.5 $\mu$m oxide thickness).

(12) Resist/oxide removal
a. Strip resist in piranha.
b. Etch oxide remaining after plasma etch in 6:1 BHF.

(13) 4500A field oxidation
a. Standard prediffusion clean:
b. Steam oxidation to grow 4500A field oxide, 5 hours at 900 C. using Thermco recipe WET4500A, tube 2-1, with TCA clean of furnace tube prior to oxidation using Thermco recipe 1TCACLN.
c. Measure oxide thickness on monitor wafers.

(14) Mask 2 (channel mask)
a. Prime wafers in LP3 (HMDS application).
b. Spin OCG825 photoresist (MTI recipe #1).
c. Expose using Mask 2 (0.6 second exposure).
d. Develop in 3:1 DI water:OCG809 (WPS 3).
e. Inspect.

(15) Channel implant (boron)
a. Dose of 1.0, 1.5 and $2.0 \cdot 10^{12}$ $cm^{-12}$, energy of 150 keV (projected range of approximately 0.4 $\mu$m), tilt angle of 7 degrees.

(16) Resist removal
a. Strip resist in piranha.

(17) Polysilicon-1 deposition
a. Standard prediffusion clean.
b. LPCVD of undoped polysilicon, 4500A. Recipe POLY4500, 53.5 minute deposition at 615/620/630 C., 40 sccm silane front/rear flow, 200 mtorr pressure.
c. Measure polysilicon thickness on monitor wafers.

(18) Polysilicon-1 implant (boron)
a. Dose of $2.0 \cdot 10^{15}$ $cm^{-2}$, energy of 80 keV (projected range of approximately 0.2 $\mu$m), tilt angle of 7 degrees.

(19) Mask 3 (polysilicon-1 mask)
a. Prime wafers in LP3 (HMDS application).
b. Spin OCG825 photoresist (MTI recipe #1).
c. Expose using Mask 3 (0.6 second exposure).
d. Develop in 3:1 DI water:OCG809 (WPS 3).
e. Inspect.

(20) Polysilicon-1 etch
a. Hard bake wafers for 30 minutes at 120 C.
b. Etch poly using lam4 plasma etcher on campus.
c. Strip resist in oxygen plasma followed by piranha clean.

(21) Backside Polysilicon-1 removal
a. Prime wafers in LP3 (HMDS application).
b. Spin OCG825 photoresist (MTI recipe #1).
c. Hard bake wafers for 30 minutes at 120 C.
d. Recoat with OCG825 photoresist (MTI recipe #1).
e. Hard bake wafers for 30 minutes at 120 C.
f. Etch poly in silicon etchant.
g. Strip resist in piranha.

(22) Polysilicon-1 oxidation
a. Stand prediffusion clean with final HF etch:
b. Wet oxidation in TCA to grow 1700A interpoly oxide, 30 minutes at 950 C. using Thermco recipe POLY2K, tube 2-1, with TCA clean of furnace tube prior to oxidation using Thermco recipe 1TCACLN.

c. Measure oxide thickness on monitor wafers using campus nanoduv.

(23) Polysilicon-2 deposition
 a. No clean necessary if wafers loaded directly from oxidation tube.
 b. LPCVD of undoped polysilicon, 4500A. Recipe POLY4500, 53.5 minute deposition at 615/620/630 C., 40 sccm silane front/rear flow, 200 mtorr pressure.
 c. Measure polysilicon thickness on monitor wafers.

(24) Polysilicon-2 implant (boron)
 a. Dose of $2.0 \cdot 10^{15}$ cm$^{-2}$, energy of 80 keV (projected range of approximately 0.2 $\mu$m), tilt angle of 7 degrees.

(25) Mask 4 (polysilicon-2 mask)
 a. Prime wafers in LP3 (HMDS application).
 b. Spin OCG825 photoresist (MTI recipe #1).
 c. Expose using Mask 4 (0.6 second exposure).
 d. Develop in 3:1 DI water:OCG809 (WPS 3).
 e. Inspect.

(26) Polysilicon-2 etch
 a. Hard bake wafers for 30 minutes at 120 C.
 b. Etch poly using lam4 plasma etcher on campus.
 c. Strip resist in oxygen plasma followed by piranha clean.

(27) Backside Polysilicon-2 removal
 a. Prime wafers in LP3 (HMDS application).
 b. Spin OCG825 photoresist (MTI recipe #1).
 c. Hard bake wafers for 30 minutes at 120 C.
 d. Recoat with OCG825 photoresist (MTI recipe #1).
 e. Hard bake wafers for 30 minutes at 120 C.
 f. Etch poly in silicon etchant.
 g. Strip resist in piranha.

(28) Polysilicon-2 oxidation
 a. Standard prediffusion clean with final HF etch:
 b. Wet oxidation in TCA to grow 1700A interpoly oxide, 30 minutes at 950 C. using Thermco recipe POLY2K, tube 2-1, with TCA clean of furnace tube prior to oxidation using Thermco recipe 1TCACLN.
 c. Measure oxide thickness on monitor wafers using campus nanoduv.

(29) Polysilicon-3 deposition
 a. No clean necessary if wafers loaded directly from oxidation tube.
 b. LPCVD of undoped polysilicon, 4500A. Recipe POLY4500, 53.5 minute deposition at 615/620/630 C., 40 sccm silane front/rear flow, 200 mtorr pressure.
 c. Measure polysilicon thickness on monitor wafers.

(30) Polysilicon-3 implant ((boron)
 a. Dose of $2.0 \cdot 10^{15}$ cm$^{-2}$, energy of 80 keV (projected range of approximately 0.2 $\mu$m), tilt angle of 7 degrees.

(31) Mask 5 (polysilicon-3 mask)
 a. Prime wafers in LP3 (HMDS application).
 b. Spin OCG825 photoresist (MTI recipe #1).
 c. Expose using Mask 5 (0.6 second exposure).
 d. Develop in 3:1 DI water:OCG809 (WPS 3).
 e. Inspect.

(32) Polysilicon-3 etch
 a. Hard bake wafers for 30 minutes at 120 C.
 b. Etch poly using lam4 plasma etcher on campus.
 c. Strip resist in oxygen plasma followed by piranha clean.

(33) Backside Polysilicon-3 removal
 a. Prime wafers in LP3 (HMDS application).
 b. Spin OCG825 photoresist (MTI recipe #1).
 c. Hard bake wafers for 30 minutes at 120 C.
 d. Recoat with OCG825 photoresist (MTI recipe #1).
 e. Hard bake wafers for 30 minutes at 120 C.
 f. Etch poly in silicon etchant.
 g. Strip resist in piranha.

(34) Polysilicon-3 oxidation
 a. Standard prediffusion clean with final HF etch:
 b. Wet oxidation in TCA to grow 1000A interpoly oxide, 30 minutes at 900 C. using Thermco recipe POLY1K, tube 2-1, with TCA clean of furnace tube prior to oxidation using Thermco recipe 1TCACLN.
 c. Measure oxide thickness on monitor wafers.

(35) Mask 6 (substrate contact mask)
 a. Prime wafers in LP3 (HMDS application).
 b. Spin OCG825 photoresist (MTI recipe #1).
 c. Expose using Mask 6 (0.6 second exposure).
 d. Develop in 3:1 DI water:OCG809 (WPS 3).
 e. Inspect.

(36) Oxide etch
 a. Hard bake wafers for 30 minutes at 120 C.
 b. Determine etch rate of 6:1 buffered oxide etch (BOE) rate using 1000A thermal oxide test wafer.
 c. Based on BOE etch rate and measured thickness calculate the required etch time. Etch wafers for this amount of time plus 20%, in addition to any time that may be required for wetting.
 d. After DI water rinse inspect for hydrophobic surface behavior on large etched areas. Measure remaining oxide thickness on nanospec to verify complete oxide removal.
 e. Strip resist in piranha (WPS 5).

(37) Mask 7 (substrate contact implant)
 a. Prime wafers in LP3 (HMDS application)
 b. Spin OCG825 photoresist (MTI recipe #1).
 c. Expose using Mask 7 (0.6 second exposure)
 d. Develop in 3:1 DI water:OCG809 (WPS 3).
 e. Inspect.

(38) Substrate contact implant
 a. Phosphorus, P$^+$, dose of $2 \cdot 10^{15}$ cm$^{-2}$, energy of 100 keV, tilt angle of 7 degrees, implanted in hybrid mode to limit substrate heating.
 b. Strip resist in oxygen plasma followed by piranha clean.

(39) Mask 8 (floating electrode, source/drain implant)
 a. Prime wafers in LP3 (HMDS application).
 b. Spin OCG825 photoresist (MTI recipe #1).
 c. Expose using Mask 8 (0.6 second exposure).
 d. Develop in 3:1 DI water:OCG809 (WPS 3).
 e. Inspect.

(40) Nitride etch
 a. Plasma etch nitride over active using technics-c etcher on campus.
 b. Do not strip resist.

(41) Floating electrode, source/drain implant
 a. B$^+$, dose of $2 \cdot 10^{15}$ cm$^{-2}$, energy of 50 keV, tilt angle of 7 degrees, implanted in hybrid mode to limit substrate heating.

b. Strip resist in oxygen plasma followed by piranha clean.
(42) 5000A oxide deposition (LTO/BPSG)
a. Standard prediffusion clean:
b. LPCVD of 5000A of $SiO_2$, 30 minute deposition of 425 C. using Thermco recipe UDLTO.
c. Measure oxide thickness on monitor wafers.
(43) High-temperature forming gas anneal
a. Stand prediffusion clean:
b. One hour, 950 C. anneal in forming gas using Thermco recipe FGANNEAL, tube 1-1, with TCA clean of furnace tube prior to oxidation using Thermco recipe 1TCACLN.
c. Measure oxide thickness on monitor wafers.
(44) Backside oxynitride/nitride removal
a. Prime wafers in LP3 (HMDS application).
b. Spin OCG825 photoresist (MTI recipe #1).
c. Hard bake wafers for 30 minutes at 120 C.
d. Recoat with OCG825 photoresist (MTI recipe #1).
e. Hard bake wafers for 30 minutes at 120 C.
f. Etch wafers in 6:1 buffered oxide etch (BOE) for 5 minutes to remove backside LTO/oxynitride.
g. Strip resist in piranha (WPS 5).
f. Remove backside nitride in phosphoric acid at 190 C. Note that it may be necessary to perform an intermediate dilute HF etch to remove the oxynitride between the cap and gate nitride.
(45) Backside polysilicon removal
a. Prime wafers in LP3 (HMDS application).
b. Spin OCG825 photoresist (MTI recipe #1).
c. Hard bake wafers for 30 minutes at 120 C.
d. Recoat with OCG825 photoresist (MTI recipe #1).
e. Hard bake wafers for 30 minutes at 120 C.
f. Etch wafers in silicon etch until the backside polysilicon and diffused $n^+$ layer is removed. Use monitor wafers from backside poly deposition to determine approximate etch time, and verify removal with 4-point probe measurements on wafer backside.
(46) Thin backside polysilicon deposition
a. Standard prediffusion clean with the addition of a final dilute HF etch followed by DI rinse.
b. LPCVD of doped polysilicon on wafer backside using Thermco recipe DPOLY.
c. Measure polysilicon thickness on monitor wafers.
(47) Frontside polysilicon removal
a. Plasma etch frontside poly using technics-c etcher on campus. 100 W, 280 mtorr, 13 sccm $SF_6$, 21 sccm He. Minimize over-etching due to the relatively poor selectivity of this etch to oxide.
b. Clean wafers in piranha (wps 5).
(48) Mask 9 (contact mask)
a. Prime wafers in LP3 (HMDS application).
b. Spin OCG825 photoresist (MTI recipe #1).
c. Expose using Mask 9 (0.6 second exposure).
d. Develop in 3:1 DI water:OCG809 (WPS 3).
e. Inspect.
(49) Contact etch
a. Hard bake wafers for 30 minutes at 120 C.
b. Determine etch rate of 6:1 buffered oxide etch (BOE) rate using low-temperature oxide monitor wafers.
c. Based on BOE etch rate and measured thickness calculate the required etch time. Etch wafers for this amount of time plus 20%, in addition to any time that may be required for wetting.
d. After DI water rinse inspect for hydrophobic surface behavior on large etched areas. Measure remaining oxide thickness on nanospec to verify complete oxide removal.
e. Strip resist in piranha (WPS 5). (50) 0.5 $\mu$m aluminum deposition
a. Determine etch rate of dilute HF bath.
b. Based on etch rate measurement, etch to remove 60A of oxide.
c. Load wafers into MRC603.
d. Sputter aluminum at 6 kW, 15 cm/min, 10 mtorr.
(51) Mask 10 (metal mask)
a. Prime wafers in LP3 (HMDS application).
b. Spin OCG825 photoresist (MTI recipe #1).
c. Expose using Mask 10 (0.6 second exposure).
d. Develop in 3:1 DI water:OCG809 (WPS 3).
e. Inspect.
(52) Metal etch
a. Hard bake wafers for 30 minutes at 120 C.
b. Etch wafers in aluminum etchant at 30 C.
c. Remove silicon residue in campus technics-c plasma etcher.
d. Strip resist in PRS-2000.
(53) Sinter
a. Sinter at 400 C. in forming gas using Thermco recipe SINT400, tube 1-2.
(54) Backside ITO deposition/anneal
see example 5, below.

EXAMPLE 5

Deposition of ITO Layer

The ITO layers were deposited at room temperature by RF magnetron sputtering from a target composed of 90 wt. % $In_2O_3$ and 10-wt % $SnO_2$ (target area 12 cm by 38 cm). The power used for all deposition was 500 W. The conduction in ITO is due to oxygen vacancies, and therefore the oxygen concentration in the film must be well controlled. Using deposition parameters reported in an article by Lee et al., "Electronic and optical properties of room temperature sputter deposited indium tin oxide," J. Vac. Sci and Tech., A-11, 5, 2742–6, September/October 1993, the films were reactively sputtered in a mixtures of $O_2$ and Ar. The total sputter pressure was varied from 2–8 mTorr and the $O_2$ concentration was varied from 0–5% in order to determine deposition conditions that would yield films with low resistivity and high optical transmittance.

In order to take into account both the resistivity and the transmittance in evaluating the quality of the films the thickness-independent quantity, $R_\square \ln(1/t)$, was used as a figure of merit, where $R_\square$ is the sheet resistance and t is the optical transmittance at a given wavelength. The sheet resistance of the films was measured using a four-point probe, and the optical transmittance was measured using a dual-beam spectrophotometer with a tungsten halogen lamp. Plotted as a function of $O_2$ partial pressure during film deposition, $R_\square \ln(1/t)$ exhibits a noticeable minimum; the best films result at $O_2$ partial pressures of 0.04–0.08 mTorr.

For the back contact to the photodiode arrays, ITO was deposited at a total pressure of 2 mTorr and an $O_2$ partial pressure of 0.06 mTorr. At these deposition conditions, the films exhibited resistivities of $\approx 4.8 \times 10^{-4}$ $\Omega$-cm. A low temperature, post-deposition anneal further improved the quality of the films: a one hour anneal at 200° C. in $N_2$ lowered the resistivity to ≈3.4×10⁻⁴ Ω-cm. Hall effect measurements on an ITO sample before and after annealing showed that the carrier density increased from $6.7 \times 1^{1020}$ cm⁻³ to $8.7 \times 10^{20}$ cm⁻³ and that the carrier mobility changed slightly, from 19 cm²/V-sec to 21 cm²/V-sec. The anneal also increased the transmittance for a 54.5 nm-thick film as shown in the FIG. 3 of the paper by S. Holland et al., "Development of low noise, backside illuminated silicon photodiode arrays", IEEE Transaction on Nuclear Science, 44(3); 443–7, June 1997. The transmittance particularly increased at wavelengths just below 400 nm, perhaps indicating an increase in the energy gap of the material. The transmittance at λ=415 nm, the wavelength at peak emission for lutetium orthosilicate, increased from 73% to 83%.

EXAMPLE 6
Image of a Test Pattern using 400 nm Light

CCDs were fabricated with a 20 nm backside polysilicon layer. In addition, an antireflection coating of approximately 50 nm of ITO was sputter deposited over the polysilicon (S. Holland et al., "Development of low noise, backside illuminated silicon photodiode arrays", IEEE Transaction on Nuclear Science, 44(3); 443–7, June 1997). This layer was electrically conducting and reduced the resistance of the backside contact in addition to acting as an antireflection coating.

CCDs were mounted on specially designed aluminum nitride circuit boards having an opening for backside illumination. Aluminum nitride was chosen for its excellent coefficient of thermal expansion match to silicon, in addition to its high thermal conductivity. A standard package used at Lick Observatory was modified to accommodate the aluminum nitride substrates. A test pattern image was taken with a back-illuminated CCD at −120° C. The backside voltage was 25 V and resulted in over-depletion of the substrate. The wavelength of the incident light was 400 nm. The absorption depth in silicon at this wavelength is approximately 0.2 μm. The photon-generated charge carriers must therefore drift to the CCD potential wells located 300 μm away. This demonstrates use of the inventive CCD to image short wavelength photons from the backside of a 300 μm thick silicon substrate. Preliminary measurements show that the quantum efficiency for 400 nm photons is approximately 67%. In addition, first measurements indicate that lateral charge diffusion at 25V backside voltage was about one pixel width.

EXAMPLE 7
Quantum Efficiency as a Function of Wavelength for a p-i-n Photodiode having Various Thicknesses of Backside Layers, and No Antireflective Coating FIG. 3 shows the measured quantum efficiency versus wavelength for back-illuminated photodiodes with varying backside-polysilicon-layer thicknesses. As expected the short wavelength response improves with decreasing polysilicon thickness. In addition, because of the relatively thick depletion region (300 μm) the response in the near infrared extends to a wavelength of approximately 1 μm.

The quantum efficiency was measured by comparison to a photodiode with a known spectral response. A tungsten lamp was used for λ=400–1100 μm, and a Hg vapor lamp was used for λ=300–450 nm. The light passed through a monochromator and was focused on the test photodiode and the calibrated photodiode via optical fibers. FIG. 3 shows the measured quantum efficiency is essentially equal to the quantum efficiency calculated by assuming only reflection loss due to the mismatch in the refractive indices of silicon and air (silicon refractive index≈3.7). At shorter wavelengths, the loss of collected charge due to the absorption in the polysilicon contact causes the quantum efficiency to deviate from the reflection limit. Note that for the thinnest film (10 nm), the measured quantum efficiency is very close to the reflection limit; at λ=415 nm, the reduction in quantum efficiency that can be attributed to loss in the polysilicon layer is ≈6%.

EXAMPLE 8
Quantum Efficiency as a Function of Wavelength for a p-i-n Photodiode having Various Thicknesses of Backside Layers, and Having an Antireflective Coating The thickness of an ITO antireflective coating is chosen so that it minimizes reflection by acting as a quarter-wave plate for the wavelength of interest, i.e.

$$X_{ITO} = \lambda/4n$$

where $X_{ITO}$ is the ITO film thickness that minimizes reflection at the wavelength λ, and n is the refractive index of ITO. FIG. 4 shows the quantum efficiency as a function of wavelength for a back-illuminated, 300 μm thick p-i-n photodiode having a 10 nm backside layer coated with 57 nm ITO (solid line). The inventive photodiode was operated at room temperature (Ibid. IEEE Nuc. Sci.). The thickness was chosen to maximize the quantum efficiency at the 415 nm wavelength of a photon emitted from lutetium orthosilicate (LSO). The improvement in quantum efficiency due to the antireflective coating exceeds 60% over a 100 nm wavelength range and peaks at λ~450 nm, close to the target value. As shown in FIG. 4, the combination of a thin polysilicon contact and quarter-wave ITO layer yields a QE of approximately 75% at the LSO wavelength. For bismuth germanate (BGO), the quantum efficiency was even higher, about 90% at 480 nm. It could be further improved by optimizing the ITO thickness for the BGO wavelength.

The circular data points were taken from a CCD made with the inventive combination of a 300 μm silicon substrate having a 10 nm conducting backside layer of polysilicon, coated with approximately 57 nm ITO. The CCD was used in an astronomical camera operated at −120° C.

For purposes of comparison, the broken line shows data taken with a conventional back-illuminated CCD, fabricated on a thinned, low resistance silicon substrate and having a standard antireflective coating (M. Blouke and M. D. Nelson, "Stable ultraviolet antireflection coatings for charge-coupled devices", SPIE 1900; 228–240, 1993).

EXAMPLE 9
Charge Diffusion as a Function of Backside Voltage

Using a CCD, constructed on a 300 μm substrate, and having a 20 nm backside layer of polysilicon, coated with 50 nm thick ITO, several characteristics were measured. They are itemized in Table II below and are thoroughly discussed in a publication of the Proceedings from the International Society of Optical Engineering meeting February 1997: SPIE v 3019, pp 183–8 by R. J. Stover et al. entitled, "Characterization of a fully depleted CCD on high resistivity silicon", incorporated herein by reference.

TABLE II

| Parameter | Value |
| --- | --- |
| Charge Transfer Efficiency | >0.99995 |
| Read noise | 4 to 6 e⁻ |
| Dark current | 0.014 e⁻/sec |
| Full well charge capacity | 300 Ke⁻ |

Because photo-generated carriers produced near the back of the inventive CCD described in the paragraph above must drift 300 µm to the frontside, diffusion and spreading of the charge is an important factor. To minimize lateral diffusion the substrate is fully depleted of charges using a backside voltage to eliminate any field free regions. Also, by maintaining as high a drift field as possible by using a backside voltage, the transit time across the 300 µm is kept short, also minimizing diffusion. FIG. 5 shows charge spreading (Sigma) as a function of backside voltage. It is fairly weak once the substrate is fully depleted of charge carriers. To investigate the dependence of charge diffusion on backside voltage, a mask was made having a series of small pinholes. Two, four, and eight µm pinholes were used, but size of the pinhole had little effect on the measured spot size. The mask was laid directly on the back surface of the CCD and illuminated using 400 nm light from a small light source. The backside voltage was then varied and images were obtained. The root-mean-square (RMS) spreads in x and y for each spot were computed and the average is plotted as a function of voltage in FIG. 5. Typically the backside voltage of a 300 µm thick CCD is 25 volts (described in detail in S. Holland et al. "Development of back-illuminated, fully-depleted CCD image sensors for use in astronomy and astrophysics", IEEE Workshop on Charge-Coupled Devices & Advanced Image Sensors, Bruge, Belgium, Jun. 5–7, 1997).

Thus, the invention provides an electrically conducting layer attached to the backside of a high resistivity silicon detector and bias voltage applied between the backside and front patterned side of the detector. The electrically conducting layer can be thin enough to be transparent to short wavelength photons (such as blue) or long wavelength photons or both, as needed for the particular application. Some devices for which the invention has been found useful are photodiodes, CCDs (particularly for low light circumstances), x-ray Detector; and direct detection of x-rays (using an active volume thickness of 300 µm, sensitivity to about 5.9 keV x-rays was achieved). In principle, using thicker substrates enables higher energy x-rays to be detected. There are several advantages conferred on devices when the invention is used. Applying a voltage bias across the photon-sensitive volume on the devices that use the inventive combination improves output transistor characteristics and the potential well geometry on CCDs. In addition, The inventive CCD substrate is custom fabricated to have an extremely low N as shown in Table I.;

Substrate bias used to deplete substrate improves output amplifier characteristics and probably CCD wells;

Back window is transparent, electrically conducting and compatible with required substrate bias;

Better near IR detection due to thicker photon sensitive volume;

God blue response without the need for thinning, as current technology requires to achieve blue region sensitivity.

Less warpage compared to thinned CCDs;

Good long and short wavelength transmission through backside window;

Fringing in the red, which is a problem with thinned CCDs, is eliminated

The backside window layer can withstand bias voltages necessary to fully deplete the high-resistivity substrate without causing significant increases in dark current (the bias voltage causes the small number of mobile electrons in the high-resistivity n-type substrate to be removed, leaving behind ionized donor atoms which result in the electric field necessary to collect the photogenerated charges before they recombine or diffuse out, which would cause a loss of spatial resolution).

The description of illustrative embodiments and best modes of the present invention is not intended to limit the scope of the invention. Various modifications, alternative constructions and equivalents may be employed without departing from the true spirit and scope of the appended claims.

I claim:

1. A back-illuminated photon sensing element comprising,
   a) a photon-sensitive silicon substrate having a frontside and a backside; and
   b) an electrically-conducting photon-transparent silicon layer attached to the backside of the photon-sensitive substrate.

2. The photon sensing element of claim 1 wherein the photon-sensitive silicon substrate is between about 20 µm and about 5000 µm thick.

3. The photon sensing element of claim 1 wherein the photon-sensitive silicon substrate is between about 40 µm and about 4000 µm thick.

4. The photon sensing element of claim 1 wherein the photon-sensitive silicon substrate is between about 50 µm and about 2000 µm thick.

5. The photon sensing element of claim 1 wherein the photon-sensitive silicon substrate is between about 75 µm and about 1000 µm thick.

6. The photon sensing element of claim 1 wherein the photon-sensitive silicon substrate is between about 100 µm and about 750 µm thick.

7. The photon sensing element of claim 1 wherein the photon-sensitive silicon substrate is between about 100 µm and about 625 µm thick.

8. The photon sensing element of claim 1 wherein the photon-sensitive silicon substrate is between about 200 µm and about 625 µm thick.

9. The photon sensing element of claim 1 wherein the photon-sensitive silicon substrate is between about 250 µm and about 625 µm thick.

10. The photon sensing element of claim 1 wherein the photon-sensitive silicon substrate is between about 300 µm and about 550 µm thick.

11. The photon sensing element of claim 1 wherein the photon-sensitive silicon substrate resistivity, $\rho$, is between about 3 K$\Omega$-cm and about 20 k$\Omega$-cm.

12. The photon sensing element of claim 1 wherein the photon-sensitive silicon substrate resistivity, $\rho$, is between about 100 $\Omega$-cm and about 20 k$\Omega$-cm.

13. The photon sensing element of claim 1 wherein the photon-sensitive silicon substrate resistivity, $\rho$, is between about 1 K$\Omega$-cm and about 20 k$\Omega$-cm.

14. The photon sensing element of claim 1 wherein the photon-sensitive silicon substrate resistivity, $\rho$, is between about 10.5 K$\Omega$-cm and about 20 k$\Omega$-cm.

15. The photon sensing element of claim 12 wherein the photon-sensitive substrate comprises n-type silicon.

16. The photon sensing element of claim 12 wherein the photon-sensitive substrate comprises p-type silicon.

17. The photon sensing element of claim 1 wherein the backside layer is between about 10 nm and about 100 µm thick.

18. The photon sensing element of claim 1 wherein the backside layer is between about 10 nm and about 10 µm thick.

19. The photon sensing element of claim 1 wherein the backside layer is between about 10 nm and about 1 µm thick.

20. The photon sensing element of claim 1 wherein the backside layer is between about 10 nm and about 100 nm thick.

21. The photon sensing element of claim 1 wherein the backside layer is between about 10 nm and about 50 nm thick.

22. The photon sensing element of claim 1 wherein the backside layer is doped to between about 0.0001 and about 10 atomic percent with phosphorous.

23. The photon sensing element of claim 1 wherein the backside layer is doped to between about 0.001 and about 3 atomic percent with phosphorous.

24. The photon sensing element of claim 1 wherein the backside layer is doped to between about 0.1 and about 3 atomic percent with phosphorous.

25. The photon sensing element of claim 1 further comprising an antireflecting coating on the backside of the backside layer, chosen from the group consisting of transparent conducting oxides, indium tin oxide, silicon dioxide, silicon nitride, magnesium fluoride, hafnium oxide, lead oxide, and aluminum oxide.

26. The photon sensing element of claim 25 wherein the antireflecting layer is from the group of materials known as transparent conducting oxides.

27. The photon sensing element of claim 26 wherein the antireflecting layer is indium tin oxide.

28. An electromagnetic radiation detector comprising,
   a) a photon-sensitive high-resistivity silicon substrate having a frontside and a backside;
   b) a layer of electrically conducting silicon attached to the backside of the photon-sensitive substrate; and
   c) a charge collecting region on the frontside of the photon-sensitive substrate.

29. The detector of claim 28 wherein the photon-sensitive substrate is between about 200 $\mu$m and about 750 $\mu$m thick.

30. The detector of claim 29 wherein the backside layer has a thickness that is transparent to photons having a wavelength between about 400 nm and about 1100 nm.

31. The detector of claim 30 further comprising an antireflective coating applied to the backside layer.

32. The detector of claim 31 wherein the antireflective coating is electrically conducting.

33. The detector of claim 28 further comprising a voltage source connected to the backside layer.

34. The electromagnetic radiation detector of claim 28 having an array of pixels comprising,
   a) a doped charge collecting region;
   b) an oppositely doped stop region; and
   c) a region of high resistivity silicon between and adjacent to the charge collecting region and the stop region.

35. A back-illuminated photodiode comprising a) a photon-sensitive silicon substrate having a frontside and a backside;
   b) a layer of electrically conducting polycrystalline silicon attached to the backside of the photon-sensitive substrate, said layer having a thickness that is transparent to the photons being detected;
   c) a charge collecting region on the frontside of the photon-sensitive substrate; and
   d) an electrical connection for a voltage source on the backside layer.

36. A back-illuminated charge coupled device comprising,
   a) a high-resistivity photon-sensitive silicon substrate having a thickness between about 200 $\mu$m and about 1 mm and having a frontside and a backside;
   b) charge coupled circuitry patterned on the frontside;
   c) a layer of electrically-conducting polycrystalline silicon having a thickness between about 10 nm and about 1 $\mu$m attached to the backside of the photon-sensitive substrate; and
   d) an electrical connection for a voltage source on the backside layer.

37. The charged couple device of claim 36 wherein the photon-sensitive silicon substrate has a resistivity between about 1 K$\Omega$-cm and about 20 k$\Omega$-cm.

38. The charged couple device of claim 36 further comprising an antireflective coating applied to the backside layer.

39. The charged couple device of claim 36 further comprising a voltage source connected to the electrical connection.

40. A back-illuminated charge coupled device comprising,
   a) a low-resistivity photon-sensitive silicon substrate having a thickness between about 20 $\mu$m and about 50 $\mu$m and having a frontside and a backside;
   b) charge coupled circuitry patterned on the frontside;
   c) a layer of electrically-conducting polycrystalline silicon having a thickness between about 10 nm and about 1 $\mu$m attached to the backside of the photon-sensitive substrate; and
   d) an electrical connection for a voltage source on the backside layer.

41. The charged couple device of claim 40 wherein the photon-sensitive silicon substrate has a resistivity between about 1 $\Omega$-cm and about 100 $\Omega$-cm.

* * * * *